United States Patent
Kodama et al.

(10) Patent No.: US 11,751,446 B2
(45) Date of Patent: Sep. 5, 2023

(54) DISPLAY DEVICE HAVING FIRST, SECOND, THIRD AND FOURTH TRANSISTORS, AND ELECTRONIC APPARATUS

(71) Applicant: SEIKO EPSON CORPORATION, Tokyo (JP)

(72) Inventors: Takumi Kodama, Suwa (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 259 days.

(21) Appl. No.: 17/150,595

(22) Filed: Jan. 15, 2021

(65) Prior Publication Data
US 2021/0225990 A1    Jul. 22, 2021

(30) Foreign Application Priority Data

Jan. 17, 2020 (JP) .................................. 2020-005726

(51) Int. Cl.
*H01L 29/08* (2006.01)
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC .................... H01L 27/3276; H01L 27/3262
USPC ............................................... 257/40
See application file for complete search history.

(56) References Cited

U.S. PATENT DOCUMENTS

| | | |
|---|---|---|
| 2008/0158110 A1 | 7/2008 | Iida et al. |
| 2009/0251493 A1 | 10/2009 | Uchino et al. |
| 2009/0284515 A1 | 11/2009 | Tsuge |
| 2013/0093737 A1 | 4/2013 | Ota et al. |
| 2013/0135275 A1 | 5/2013 | Okuno et al. |
| 2014/0168195 A1 | 6/2014 | Kumeta et al. |
| 2014/0320549 A1 | 10/2014 | Kumeta et al. |
| 2016/0307499 A1 | 10/2016 | Toyomura et al. |
| 2017/0125503 A1* | 5/2017 | Ota ...................... H01L 27/3265 |
| 2018/0261155 A1* | 9/2018 | Ota ...................... H01L 51/5221 |

FOREIGN PATENT DOCUMENTS

| | | |
|---|---|---|
| JP | 2008-164796 A | 7/2008 |
| JP | 2009-163275 A | 7/2009 |
| JP | 2009-276669 A | 11/2009 |
| JP | 2013-061452 A | 4/2013 |
| JP | 2014-119574 A | 6/2014 |
| JP | 2014-215425 A | 11/2014 |

(Continued)

*Primary Examiner* — Phuc T Dang
(74) *Attorney, Agent, or Firm* — Oliff PLC

(57) ABSTRACT

The display device includes a pixel circuit provided corresponding to a data line and a scanning line, the pixel circuit includes first to fourth transistors and a display element, and the first transistor supplies a current in accordance with a voltage between a gate node and a source node to the display element via the fourth transistor, the second transistor is disposed between the data line and the gate node of the first transistor and is turned on and off in accordance with a potential of the scanning line, the third transistor is disposed between the data line and a drain node of the first transistor, and the fourth transistor is disposed between the drain node of the first transistor and the display element.

9 Claims, 13 Drawing Sheets

(56) References Cited

FOREIGN PATENT DOCUMENTS

| | | | |
|---|---|---|---|
| JP | 2016-212444 | A | 12/2016 |
| JP | 2018-116303 | A | 7/2018 |
| JP | 2018-151506 | A | 9/2018 |

\* cited by examiner

DISPLAY DEVICE HAVING FIRST, SECOND, THIRD AND FOURTH TRANSISTORS, AND ELECTRONIC APPARATUS

The present application is based on, and claims priority from JP Application Serial Number 2020-005726, filed Jan. 17, 2020, the disclosure of which is hereby incorporated by reference herein in its entirety.

BACKGROUND

1. Technical Field

The present disclosure relates to a display device and an electronic apparatus.

2. Related Art

A display device using, for example, an organic light emitting diode (OLED) as a display element is known. In this display device, a pixel circuit including a display element, a transistor, and the like is generally provided corresponding to a pixel of an image to be displayed. In addition, the display device often requires miniaturization of a display size and higher definition of display. In order to achieve both the miniaturization in the display size and the higher definition of the display, since the pixel circuit needs to be miniaturized, a technology in which a display device is integrated on a semiconductor substrate, such as silicon, for example, has been proposed (refer to, for example, JP-A-2016-212444).

JP-A-2016-212444 also proposes a technique in which a threshold of a transistor is compensated and a decrease in display quality is curbed when a current to a display element is controlled.

However, in the above-described technology, five transistors have to be provided in one pixel circuit, and this has become a hindrance to miniaturization and high definition.

SUMMARY

A display device according to an aspect of the present disclosure includes a pixel circuit provided corresponding to a data line and a scanning line, wherein the pixel circuit includes a first transistor, a second transistor, a third transistor, a fourth transistor, and a display element, the first transistor supplies a current in accordance with a voltage between a gate node of the first transistor and a source node of the first transistor to the display element via the fourth transistor, the second transistor is disposed between the data line and the gate node of the first transistor and is turned on or off in accordance with a potential of the scanning line, the third transistor is disposed between the data line and a drain node of the first transistor, and the fourth transistor is disposed between the drain node of the first transistor and the display element.

DESCRIPTION OF EXEMPLARY EMBODIMENTS

Hereinafter, the display device according to an exemplary embodiment of the present disclosure will be described with reference to the drawings. In each of the drawings, a size and a scale of each unit is different from an actual size and an actual scale of each unit as appropriate. Moreover, although the exemplary embodiments described below are suitable specific examples, and thus various technically preferable limitations are applied, the scope of the present disclosure is not limited to these modes unless there is a description to limit the present disclosure in the following description.

Figure 1:
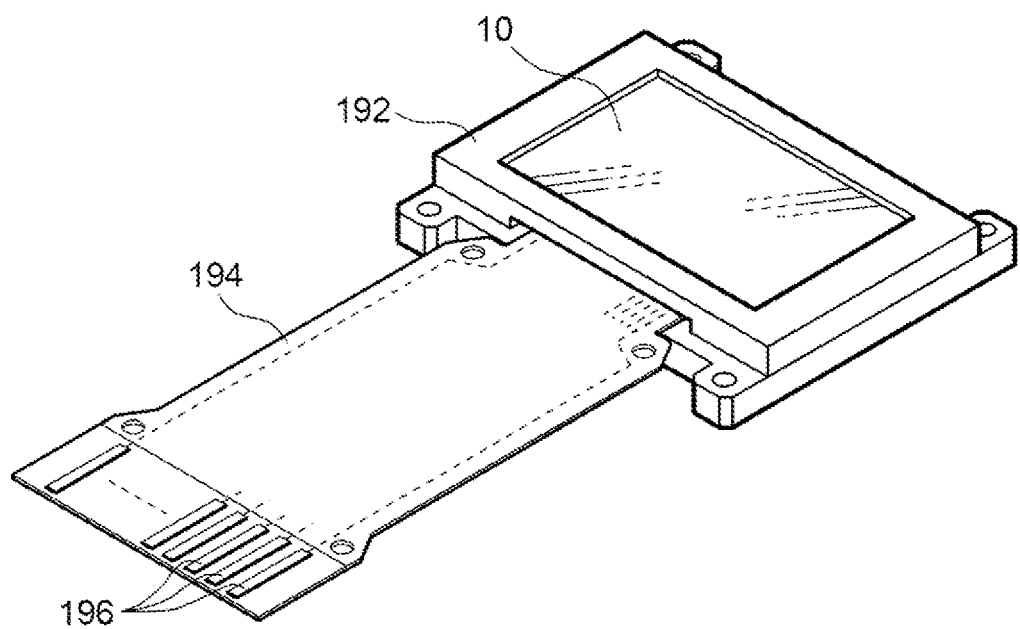
FIG. 1 is a perspective view showing a configuration of a display device according to an exemplary embodiment.
Figure 2:
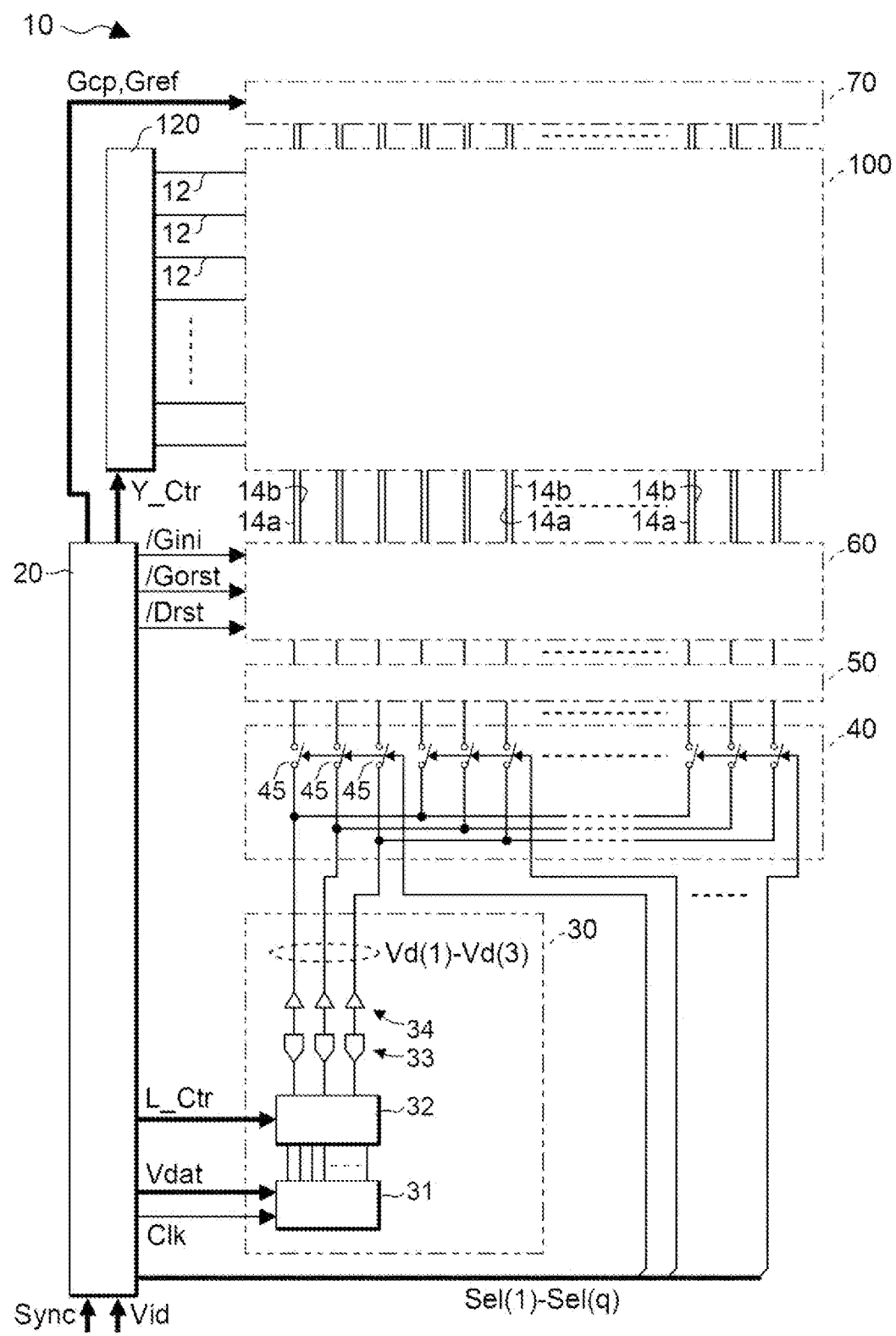
FIG. 2 is a block diagram showing a configuration of the display device.

FIG. 1 is a perspective view showing a configuration of a display device 10 according to an exemplary embodiment, and FIG. 2 is a block diagram showing the configuration of the display device 10.

The display device 10 is a micro display panel configured to display a color image, for example, in a head-mounted display or the like, and a plurality of pixel circuits and a driving circuit configured to drive the pixel circuits and the like are formed on a semiconductor substrate. The semiconductor substrate is typically a silicon substrate, but may be another semiconductor substrate.

The display device 10 is accommodated in a frame-shaped case 192 that opens in a display region, and one end of a flexible printed circuit (FPC) substrate 194 is coupled to the display device 10. A plurality of terminals 196 to be coupled to an external host device are provided on the other end of the FPC board 194. The host device outputs an image signal and a synchronization signal for display on the display device 10.

As shown in FIG. 2, the display device 10 includes a control circuit 20, a data signal output circuit 30, a switch group 40, a capacitive element group 50, an initialization circuit 60, an auxiliary circuit 70, a display region 100, and a scanning line drive circuit 120.

In the display region 100, scanning lines 12 of m rows are provided in a left and right direction in FIG. 2, and data lines 14b of 3q columns are provided in a vertical direction to maintain electrical isolation with each of the scanning lines 12.

Each of m and q is an integer equal to or greater than 2. Also, as described above, the pixel circuits are provided corresponding to intersections between the scanning lines 12 of the m rows and the data lines 14b of the 3q columns.

The control circuit 20 controls each unit based on an image signal Vid and a synchronization signal Sync output from the host device. The image signal Vid supplied in synchronization with the synchronization signal Sync specifies a gradation level of pixels in an image to be displayed, for example, in 8 bits for each of R, G, and B. Further, the synchronization signal Sync includes a vertical synchronization signal instructing a vertical scanning start of the image signal Vid, a horizontal synchronization signal instructing a horizontal scanning start, and a dot clock signal indicating a timing of one pixel in the image signal.

The control circuit 20 generates control signals Gcp, Gref, Y_Ctr, /Gini, /Gorst, /Drst, L_Ctr, and Sel(1) to Sel(q), and a clock signal Clk to control each unit. Although omitted in FIG. 2, the control circuit 20 outputs a control signal /Gcp having a logical inversion relationship with the control signal Gcp, a control signal /Gref having a logical inversion relationship with the control signal Gref, and a control signal /Sel(1) to /Sel(q) having a logical inversion relationship with Sel(1) to Sel(q).

In these control signals, an L level is 0V which is a reference for voltage zero, and an H level is, for example, 6.0V. Further, the control signal /Gel has three values in which an M level is added to the L level and the H level. The M level is a level having an intermediate value between the L level and the H level and is, for example 4 to 5V.

In addition, the control circuit 20 appropriately processes the image signal Vid, up-converts the signal into, for example, 10 bits, and then outputs the converted signal as an image signal Vdat. The control circuit 20 includes a lookup table that converts the image signal Vdat into the image signal Vid, a register that stores various setting parameters, and the like.

The scanning line drive circuit 120 is a circuit that drives pixel circuits arranged in m rows and 3q columns in units of one row in accordance with the control signal Y_Ctr.

The data signal output circuit 30 outputs a first data signal. Specifically, the data signal output circuit 30 outputs the first data signal, that is a voltage corresponding to a gradation level of a pixel represented by a pixel circuit, that is, a pixel in an image to be displayed, before a voltage amplitude is compressed.

In the embodiment, the voltage amplitude of the first data signal output from the data signal output circuit 30 is compressed and then supplied to the data line 14b as a second data signal. Accordingly, the second data signal after compression is also a voltage in accordance with the gradation level of the pixel. In other words, the voltage of the data line 14b is a voltage in accordance with the gradation level of the pixel.

Also, the data signal output circuit 30 also has a function of parallel-converting the image signals Vdat supplied in series into a plurality of phases (in this example, "three" phases having a coefficient of q) and outputting the same.

The data signal output circuit 30 includes a shift register 31, a latch circuit 32, a D/A converter circuit group 33, and an amplifier group 34.

The shift register 31 sequentially transmits the image signals Vdat supplied in series in synchronization with the clock signal Clk, and stores the signals for one row, i.e., 3q pixel circuits in terms of the number of pixel circuits.

The latch circuit 32 latches the image signals Vdat for 3q pixel circuits stored in the shift register 31 in accordance with the control signal L_Ctr, parallel-converts the latched image signals Vdat into the three phases in accordance with the control signal L, and outputs the same.

The D/A converter circuit group 33 includes three digital to analog (D/A) converters. The three-phase image signals Vdat output from the latch circuit 32 are converted into analog signals by the three D/A converters.

The amplifier group 34 includes three amplifiers. The three amplifiers amplify the three-phase analog signals output from the D/A converter circuit group 33 and output them as first data signals Vd(1), Vd(2), and Vd(3).

The control circuit 20 outputs control signals Sel(1) to Sel(q) that sequentially exclusively become the H level in a compensation period prior to a write period as will be described below.

Figure 3:
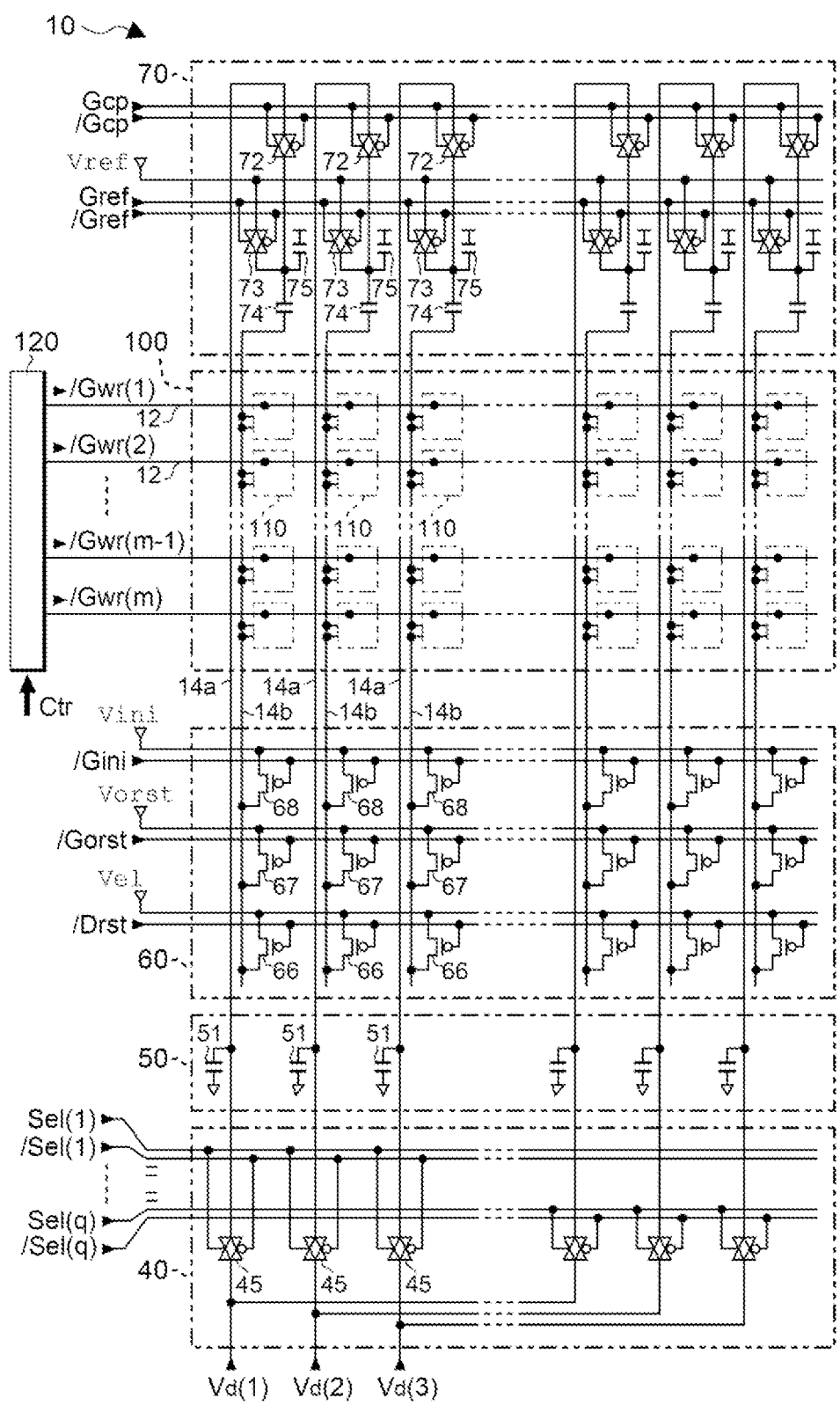
FIG. 3 is a circuit diagram showing a configuration of a main portion of the display device.

FIG. 3 is a circuit diagram showing the configuration of the switch group 40, the capacitive element group 50, the initialization circuit 60, the auxiliary circuit 70, and the display region 100 in the display device 10.

In the display region 100, pixel circuits 110 corresponding to pixels of an image to be displayed are provided in a matrix pattern. Specifically, the pixel circuits 110 are provided corresponding to intersections between scanning lines 12 of the m rows and the data lines 14b of the 3q columns. Thus, in the drawing, the pixel circuits 110 are arranged in a matrix pattern including m rows vertically and 3q columns horizontally. Here, to distinguish the rows from each other in the matrix array, the rows may be referred to as rows 1, 2, 3, ..., (m−1), and m sequentially from the top in the drawing. Similarly, to distinguish the columns from each other in the matrix, the columns may be referred to as columns 1, 2, 3, ..., (3q−1), and 3q sequentially from the left in the drawing.

In addition, the data lines 14b are grouped every three columns in FIGS. 2 and 3. When an integer j of 1 or more and q or less is used to generalize and describe a group of the data lines 14b, the data lines 14b of a total of three columns including columns (3j−2), (3j−1), and 3j belong to a j-th group counted from the left.

The three pixel circuits 110 corresponding to intersections between the scanning line 12 in the same row and three columns of the data lines 14b belonging to the same group respectively correspond to R (red), G (green), and B (blue) pixels, and these three pixels represent one dot of a color image to be displayed. That is, in the exemplary embodiment, a color of one dot is represented with an additive color mixture by a total of three pixel circuits 110 corresponding to RGB.

The scanning line drive circuit 120 generates scanning signals for sequentially scanning the scanning lines 12 for each row, in accordance with the control signal Y_Ctr. Here, the scanning signals supplied to the scanning lines 12 of rows 1, 2, 3, ..., (m−1), and m are respectively designated by /Gwr(1), /Gwr(2), ..., /Gwr(m−1), and /Gwr(m).

The scanning line drive circuit 120 generates, in addition to the scanning signals /Gwr(1) to /Gwr(m), the control signals synchronized with the scanning signals for each row, and supplies the control signals to the display region 100, but this is not illustrated in FIG. 3.

In the display device 10, a data transfer line 14a is provided corresponding to the data line 14b.

Also, the switch group 40 is a collection of transmission gates 45 provided for each of the data transfer lines 14a.

Among them, input ends of q transmission gates 45 corresponding to the data transfer lines 14a of columns 1, 4, 7, ..., and (3q−2) are commonly coupled. The first data signal Vd(1) is supplied to the input end in a time series for each pixel.

Further, the input ends of the q transmission gates 45 corresponding to the data transfer lines 14a of columns 2, 5, 8, . . . , and (3q−1) are commonly coupled, and the first data signal Vd(2) is supplied in a time series for each pixel.

Similarly, the input ends of the q transmission gates 45 corresponding to the data transfer lines 14a of columns 3, 6, 9, . . . , and 3q are commonly coupled, and the first data signal Vd(3) is supplied in a time series for each pixel.

An output end of the transmission gate 45 of a certain column is coupled to one end of the data transfer line 14a of the column.

When the control signal Sel(j) is at the H level (when the control signal /Sel(j) is at the L level), the three transmission gates 45 corresponding to the columns (3j−2), (3j−1), and 3j belonging to the j-th group are turned on between the input end and the output end.

In FIG. 3, only a first group and a q-th group are shown, and other groups are omitted due to constraints on the drawing. Further, the transmission gates 45 in FIG. 3 are simplified as simple switches in FIG. 2.

The capacitive element group 50 is a collection of capacitive elements 51 provided for each of the data transfer lines 14a. Here, one end of the capacitive element 51 corresponding to the data transfer line 14a of a certain column is coupled to one end of the data transfer line 14a, and the other end of the capacitive element 51 is grounded to a constant potential, for example, a potential that is a reference for voltage zero.

The initialization circuit 60 is a collection of P-channel MOS type transistors 66, 67 and 68 provided for each of the data lines 14b.

A control signal /Drst is supplied to a gate node of the transistor 66 corresponding to the data line 14b of a certain column, a voltage Vel is applied to a source node of the transistor 66, and a drain node of the transistor 66 is coupled to the data line 14b of the column.

Further, a control signal /Gorst is supplied to a gate node of the transistor 67 corresponding to the data line 14b of a certain column, a voltage Vorst is applied to a source node of the transistor 67, and a drain node of the transistor 67 is coupled to the data line 14b of the column.

A control signal /Gini is supplied to a gate node of the transistor 68 corresponding to the data line 14b of a certain column, a voltage Vini is applied to a source node of the transistor 68, and a drain node of the transistor 68 is coupled to the data line 14b of the column.

The auxiliary circuit 70 is a collection of transmission gates 72 and 73 provided for each column and capacitive elements 74 and 75 provided for each column.

Here, the transmission gate 72 corresponding to a certain column is turned on between the input end and the output end when the control signal Gcp is at the H level (when the control signal /Gcp is at the L level). The input end of the transmission gate 72 corresponding to a certain column is coupled to the other end of the data transfer line 14a of the column, and the output end of the transmission gate 72 corresponding to the column is coupled to an output end of the transmission gate 73 corresponding to the column, one end of the capacitive element 74 corresponding to the column, and one end of the capacitive element 75 corresponding to the column.

The transmission gate 73 corresponding to a certain column is turned on between the input end and the output end when the control signal Gref is at the H level (when the control signal /Gref is at the L level). A voltage Vref is applied to the input end of the transmission gate 73 corresponding to a certain column.

In addition, the other end of the capacitive element 75 corresponding to a certain column is grounded to a constant potential, for example, a potential that is a reference of voltage zero.

The other end of the capacitive element 74 corresponding to a certain column is coupled to one end of the data line 14b corresponding to the column.

In the exemplary embodiment, one end of the data transfer line 14a is coupled to the output end of the transmission gate 45 and one end of the capacitive element 51, and the other end of the data transfer line 14a is coupled to the input end of the transmission gate 72. Since the display region 100 is located between the switch group 40 and the auxiliary circuit 70, the data transfer line 14a passes through the display region 100.

On the other hand, the first data signal supplied to the data transfer line 14a via the transmission gate 45 is supplied as a second data signal to the pixel circuit 110 via the transmission gate 72, the capacitive element 74, and the data line 14b.

Thus, the first data signal output from the data signal output circuit 30 reaches the auxiliary circuit 70 located at the opposite position across the display region 100 via the data transfer line 14a, turns back as the second data signal, and is then supplied to the pixel circuit 110 via the data line 14b.

In this configuration, a region in which the capacitive element 74 is provided and the data signal output circuit 30 sandwich the display region 100. Therefore, when the display region 100 is used as a reference, the elements are not concentrated in a region in which the data signal output circuit 30 is provided. The display region 100 needs to be separated from four sides of the semiconductor substrate to some extent, and even in a region in which the data signal output circuit 30 is not provided, a distance from the sides is required to some extent. When the elements are concentrated in the data signal output circuit 30 and a surrounding region thereof, an area required for the region increases, and it may become a factor inhibiting miniaturization. However, in the above-described configuration, the area required for the region is reduced, and thus miniaturization can be achieved.

Figure 4:
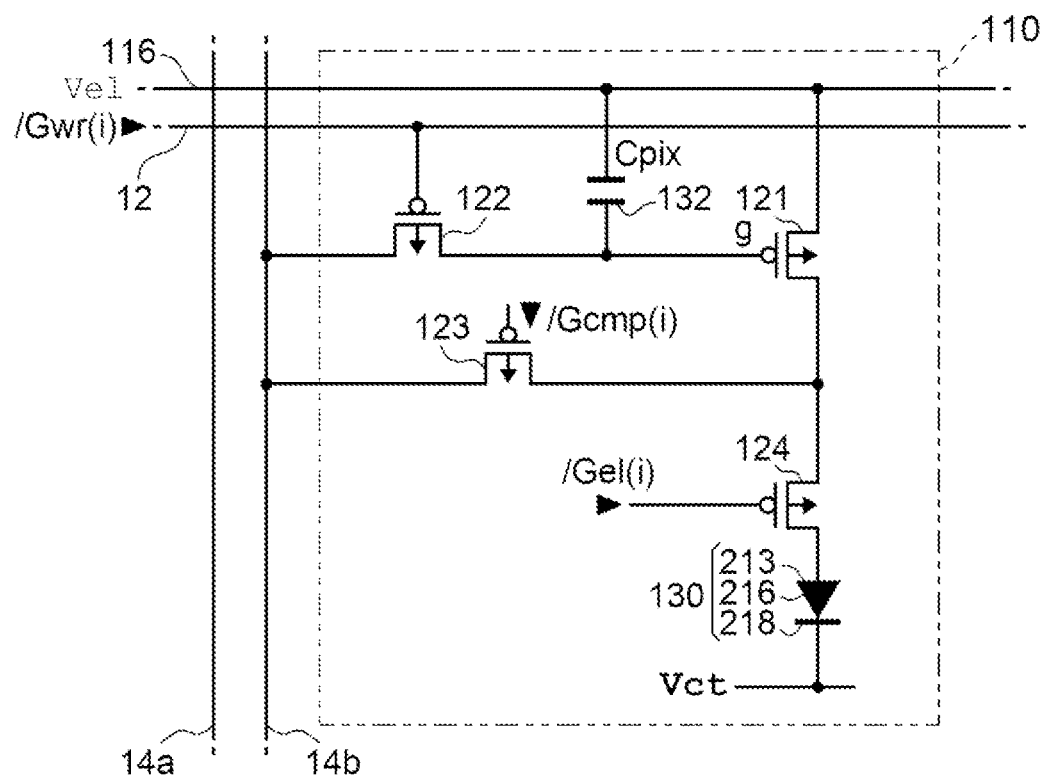
FIG. 4 is a diagram showing a configuration of a pixel circuit in the display device.

FIG. 4 is a diagram showing a configuration of the pixel circuit 110. The pixel circuits 110 arranged in m rows and 3q columns row are electrically identical to each other. Therefore, one pixel circuit 110 corresponding to an arbitrary one column in an i-th row will be described as a representative of the pixel circuits 110.

As shown in FIG. 4, the pixel circuit 110 includes P-channel transistors 121 to 124, an OLED 130, and a capacitive element 132.

Also, in addition to the scanning signal /Gwr(i), the control signals /Gcmp(i) and /Gel(i) are supplied to the pixel circuit 110 of the i-th row from the scanning line drive circuit 120.

The OLED 130 is an example of a display element, and a light emitting function layer 216 is sandwiched between a pixel electrode 213 and a common electrode 218. The pixel electrode 213 serves as an anode, and the common electrode 218 serves as a cathode. Moreover, the common electrode 218 has optical transparency.

When a current flows from the anode to the cathode of the OLED 130, holes injected from the anode and electrons injected from the cathode are recombined in the light emitting function layer 216 to generate excitons, and thus white light is generated. The white light generated at this time resonates in an optical resonator including a reflective film and a half mirror which are not shown, and is emitted at a resonant wavelength set corresponding to any color of RGB. A color filter corresponding to the color is provided in a path through which light is emitted from the optical resonator. Thus, the light emitted from the OLED 130 is visible to an observer through coloration by the optical resonator and the color filter.

The OLED 130 provided in the pixel circuit 110 serves as the smallest unit of the display image. One pixel circuit 110 includes one OLED 130. A certain pixel circuit 110 is controlled independently of the other pixel circuits 110, and the OLED 130 emits light in a color corresponding to the pixel circuit 110 to represent one of the three primary colors.

That is, since one pixel circuit 110 represents one of the three primary colors in a color to be displayed, strictly speaking, the pixel circuit 110 should be called a sub-pixel circuit, but for the sake of brevity, it will be called a pixel circuit. When the display device 10 simply displays only light and dark monochrome images, the color filter may be omitted.

In the transistor 121, a gate node g is coupled to a drain node of the transistor 122, a source node is coupled to a power supply line 116 of the voltage Vel, and the drain node is coupled to a source node of the transistor 123 and a source node of the transistor 124. One end of the capacitive element 132 is coupled to the gate node g of the transistor 121, and the other end is coupled to the power supply line 116 of a constant voltage, for example, the voltage Vel. Thus, the capacitive element 132 will hold a voltage of the gate node g in the transistor 121.

As the capacitive element 132, for example, a capacitor that is parasitic on the gate node g of the transistor 121 may be used, and a capacitor formed by sandwiching an insulating layer between conductive layers different from each other in a silicon substrate may be used.

In the transistor 122 of the pixel circuit 110 of an arbitrary one column in the i-th row, the gate node is coupled to the scanning line 12 of the i-th row, and the source node is coupled to the data line 14b in the column.

In the transistor 123 of the pixel circuit 110 of an arbitrary one column in the i-th row, the control signal /Gcmp(i) is supplied to the gate node, and the drain node is coupled to the data line 14b of the column.

In the transistor 124 of the pixel circuit 110 in an arbitrary one column in the i-th row, the control signal /Gel(i) is supplied to the gate node, and the drain node is coupled to the pixel electrode 213, that is the anode of the OLED 130, and the drain node of the transistor 125.

The common electrode 218 that serves as the cathode of the OLED 130 is coupled to the power supply line of the voltage Vct. Further, since the display device 10 is formed on a silicon substrate, a substrate potential of each of the transistors 121 to 124 is, for example, a potential corresponding to the voltage Vel.

Figure 5:
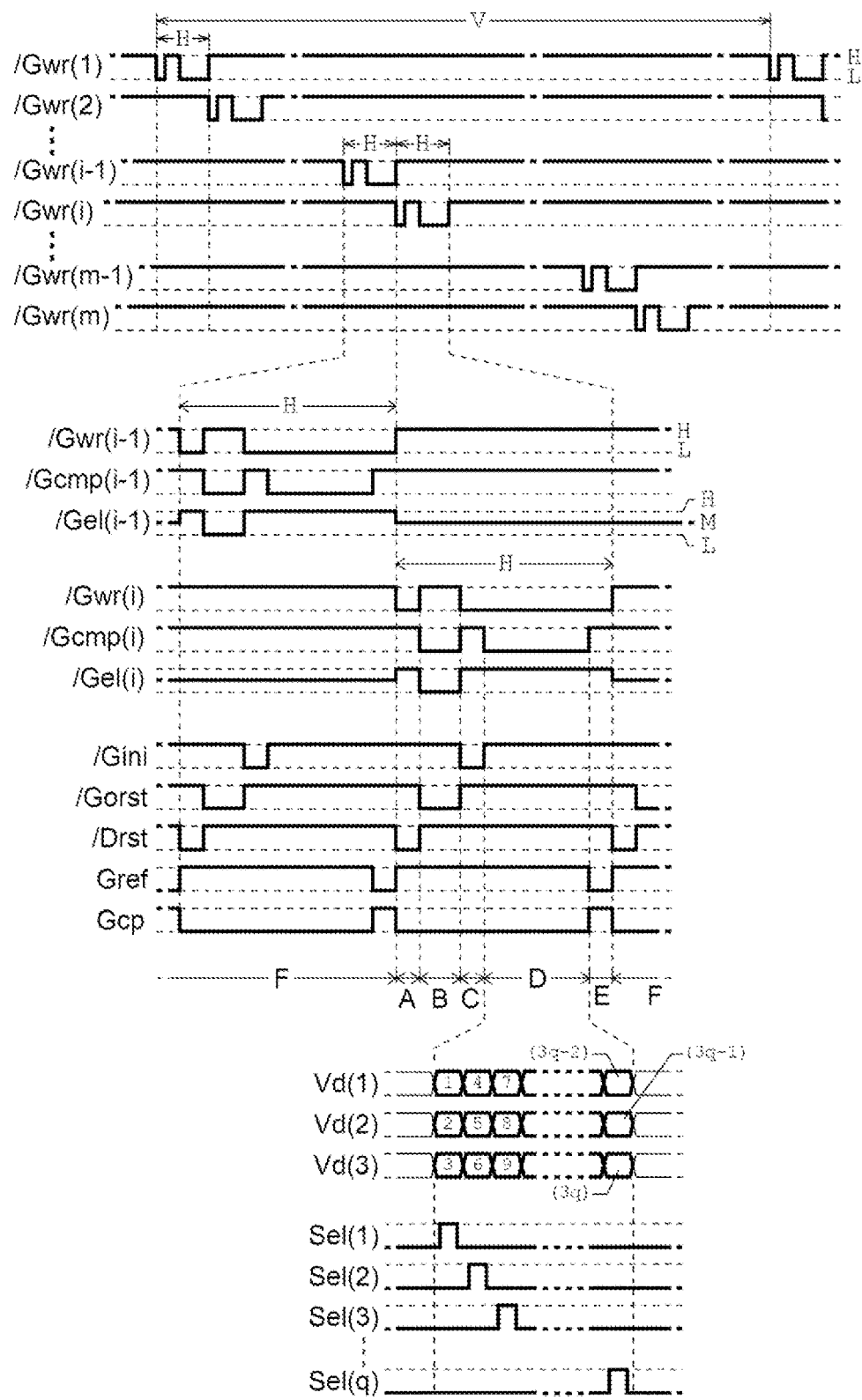
FIG. 5 is a timing chart showing an operation of the display device.

FIG. 5 is a timing chart for explaining an operation of the display device 10.

In the display device 10, horizontal scanning is performed in the order of rows 1, 2, 3, . . . , and m in a period of one frame (F).

In the present description, the period of one frame refers to a period required to display one frame of an image designated by the image signal Vid. When a length of the period of one frame is the same as that of a vertical synchronization period, for example, when a frequency of a vertical synchronization signal included in the synchronization signal Sync is 60 Hz, it is 16.7 milliseconds corresponding to one period of the vertical synchronization signal.

Furthermore, a period required for horizontal scanning for one row is a horizontal scanning period (H). In FIG. 5, a vertical scale indicating the voltage is not necessarily uniform over each signal.

An operation in the horizontal scanning period (H) in each row is substantially common in the pixel circuit 110. Further, operations of the pixel circuits 110 in the columns 1 to 3q of the row scanned in a certain horizontal scanning period (H) are also substantially common. Therefore, the following description will focus on the pixel circuit 110 in the column (3j−2) of the i-th row.

In the display device 10, the horizontal scanning period (H) is divided into five periods including initialization periods (A), (B), and (C), a compensation period (D), and a write period (E) in chronological order. In addition, as the operation of the pixel circuit 110, a light emission period (F) is further added to the five periods.

Among the initialization periods (A), (B), and (C), the initialization period (A) is a period for setting the transistor 121 to an off state and is a period for a pre-preparation process of the initialization period (C). The initialization period (B) is a process for resetting the potential at the anode of the OLED 130, and the initialization period (C) is a period in which a voltage for turning on the transistor 121 at the beginning of the compensation period (D) is applied to the gate node g.

In the initialization period (A) in each of the horizontal scanning periods (H), the control signals /Gini and /Gorst are at the H level, the control signal /Drst is at the L level, the control signal Gref is at the H level, and the control signal Gcp is at the L level. Thus, the transistor 68 is turned off, the transistor 67 is turned off, the transistor 66 is turned on, the transmission gate 73 is turned on, and the transmission gate 72 is turned off.

Further, in the initialization period (A) of the horizontal scanning period (H) in which the i-th row is selected, the scanning signal /Gwr(i) is at the L level, the control signal /Gcmp(i) is at the H level, and the control signal /Gel(i) is at the H level. Thus, in the pixel circuit 110, the transistor 122 is turned on, and the transistors 122 and 123 are turned off.

Figure 6:
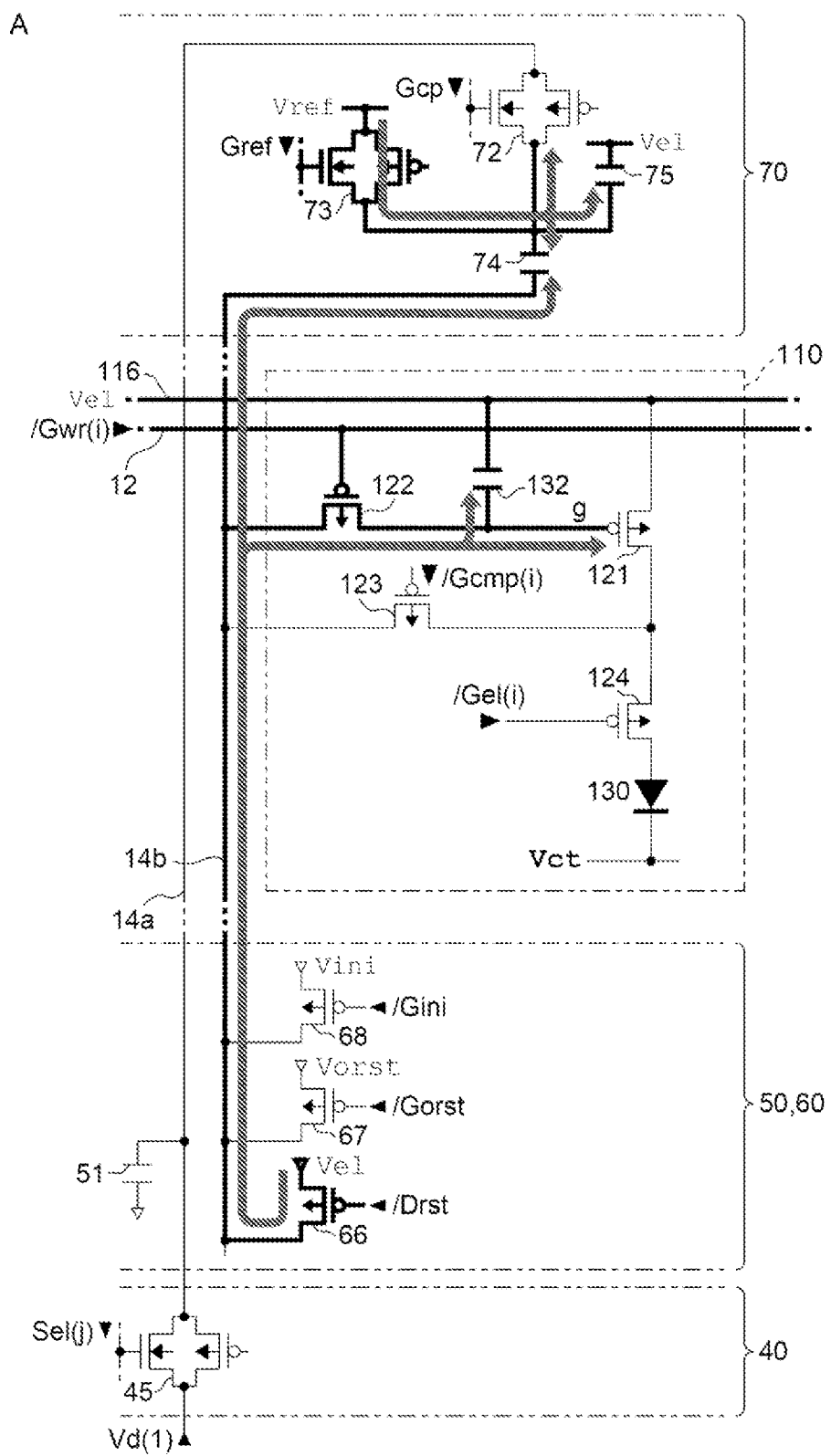
FIG. 6 is a diagram for explaining the operation of the display device.

Thus, in the initialization period (A), the voltage Vref is applied to one end of the capacitive element 74, one end of the capacitive element 75, and the output end of the transmission gate 72 via the transmission gate 73, as shown in FIG. 6. Also, in the pixel circuit 110, the voltage Vel is applied to one end of the capacitive element 132 and the gate node g of the transistor 121 via the transistor 66, the data line 14b, and the transistor 122 in order. When the voltage Vel is applied to the gate node g, a voltage between the gate node and the source node is zero, and thus the transistor 121 is forcedly turned off and a current flowing to the OLED 130 is shut off. In addition, since the voltage Vel is applied to the other end of the capacitive element 74 via the data line 14b, the capacitive element 74 is charged to a voltage |Vel−Vref|.

In the initialization period (B) in each of the horizontal scanning periods (H), the control signal /Gini is at the H level, the control signal /Gorst is at the L level, the control signal /Drst is at the H level, the control signal Gref is at the H level, and the control signal Gcp is at the L level. Thus, the transistor 68 remains off, the transistor 67 changes to be turned on, the transistor 66 changes to be turned off, the transmission gate 73 remains on, and the transmission gate 72 remains off.

Further, in the initialization period (B) of the horizontal scanning period (H) in which the i-th row is selected, the scanning signal /Gwr(i) is at the H level, the control signal /Gcmp(i) is at the L level, and the control signal /Gel(i) is at the L level. Thus, in the pixel circuit 110, the transistor 122 is turned off, and the transistors 123 and 124 are turned on.

Figure 7:
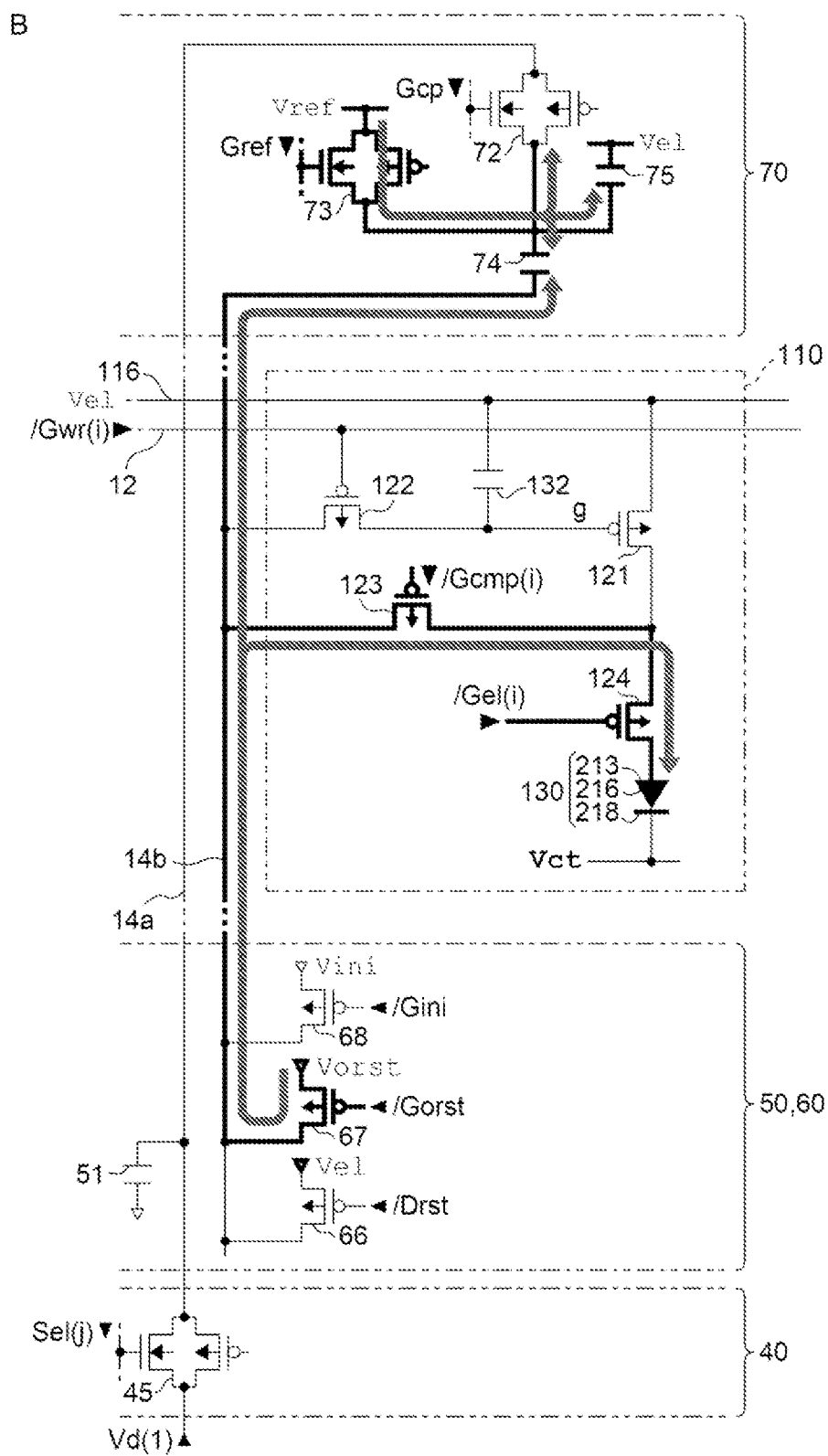
FIG. 7 is a diagram for explaining the operation of the display device.

Thus, in the initialization period (B), one end of the capacitive element 74, one end of the capacitive element 75, and the output end of the transmission gate 72 are maintained at the voltage Vref, as shown in FIG. 7. Also, in the pixel circuit 110, the voltage Vorst is applied to the pixel electrode 213, that is the anode of the OLED 130, via the transistor 67, the data line 14b, and the transistors 123 and 124 in order. In the OLED 130, since the light emitting function layer 216 is sandwiched between the pixel electrode 213 and the common electrode 218, the capacitive component is parasitic. In the initialization period (B), the voltage held in the capacitive component, specifically, the voltage according to the current flowing to the OLED 130 during the light emission period (F), is reset by the application of the voltage Vorst to the pixel electrode 213. The voltage Vorst is a voltage that causes the OLED 130 to be in a non-light-emission state, and specifically, is a zero volt corresponding to the L level or a voltage (0 to 1 volts) close to the zero voltage. In addition, since the voltage Vorst is applied to the other end of the capacitive element 74 via the data line 14b, the capacitive element 74 is charged to the voltage |Vorst−Vref|.

In the initialization period (C) in each of the horizontal scanning periods (H), the control signal /Gini is at the L level, the control signal /Gorst is at the H level, the control signal /Drst is at the H level, the control signal Gref is at the H level, and the control signal Gcp is at the L level. Thus, the transistor 68 changes to be turned on, the transistor 67 changes to be turned off, the transistor 66 remains off, the transmission gate 73 remains on, and the transmission gate 72 remains off.

Also, in the initialization period (C) of the horizontal scanning period (H) in which the i-th row is selected, the scanning signal /Gwr(i) is at the L level, the control signal /Gcmp(i) is at the H level, and the control signal /Gel(i) is at the H level. Thus, in the pixel circuit 110, the transistor 122 is turned on, and the transistors 123 and 124 are turned off.

Figure 8:
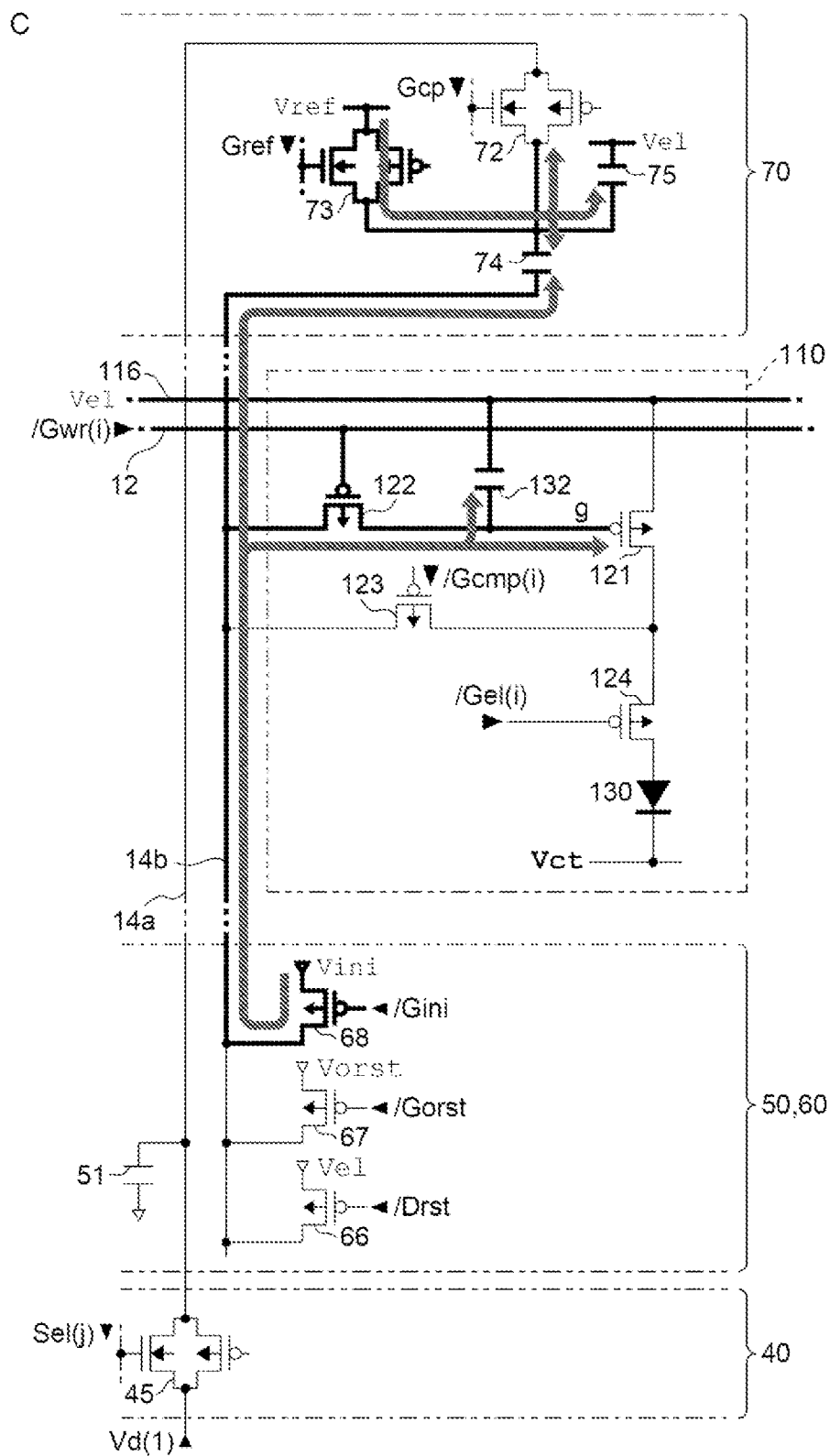
FIG. 8 is a diagram for explaining the operation of the display device.

Thus, in the initialization period (C), one end of the capacitive element 74, one end of the capacitive element 75, and the output end of the transmission gate 72 are maintained at the voltage Vref, as shown in FIG. 8. Also, in the pixel circuit 110, the voltage Vini is applied to one end of the capacitive element 132 and the gate node g of the transistor 121 via the transistor 68, the data line 14b, and the transistor 122 in order. In addition, since the voltage Vini is applied to the other end of the capacitive element 74 via the data line 14b, the capacitive element 74 is charged to a voltage |Vini−Vref|.

In the compensation period (D) in each of the horizontal scanning periods (H), the control signal /Gini is at the H level, the control signal /Gorst is at the H level, the control signal /Drst is at the H level, the control signal Gref is at the H level, and the control signal Gcp is at the L level. Thus, the transistor 68 changes to be turned off, the transistor 67 remains off, the transistor 66 remains off, the transmission gate 73 remains on, and the transmission gate 72 remains off. In addition, in the compensation period (D) of the horizontal scanning period (H) in which the i-th row is selected, the scanning signal /Gwr(i) is maintained at the L level, the control signal /Gcmp(i) changes to the L level, and the control signal /Gel(i) is maintained at the H level. Thus, in the pixel circuit 110, the transistor 122 is turned on, the transistor 123 is turned on, and the transistor 124 is turned off.

Figure 9:
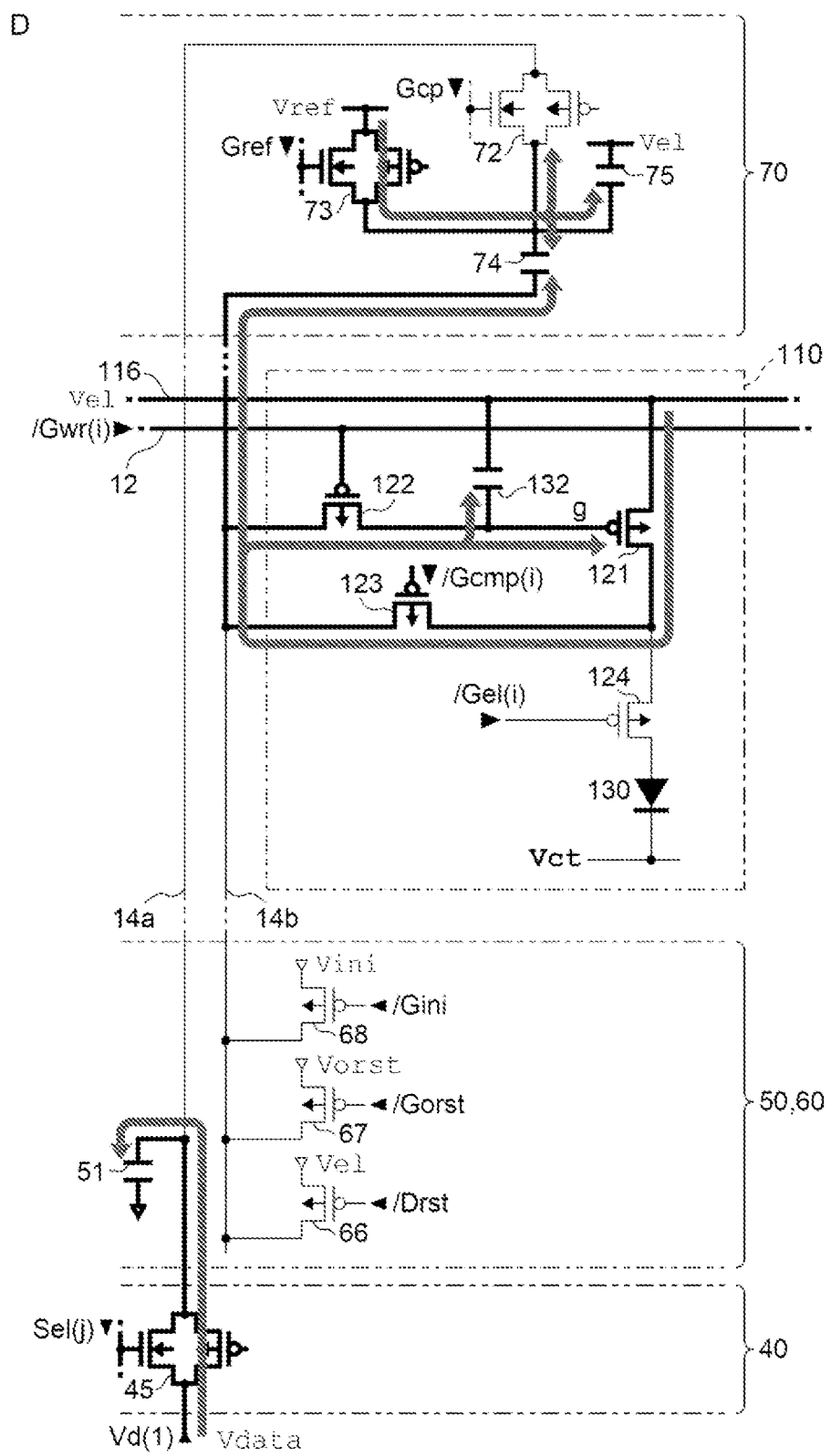
FIG. 9 is a diagram for explaining the operation of the display device.

Thus, in the compensation period (D), as shown in FIG. 9, one end of the capacitive element 74, one end of the capacitive element 75, and the output end of the transmission gate 72 are maintained at the voltage Vref.

In the pixel circuit 110, the capacitive element 132 is in a state in which the voltage (Vel−Vini) is held as the voltage between the gate node and the source node of the transistor 121 in the immediately preceding initialization period (C).

In this state, when the transistors 122 and 123 are turned on, the transistor 121 is turned on, and the transistor 121 is in a state in which the gate node and the drain node are coupled, that is, a diode coupled state. Accordingly, a voltage Vgs between the gate node and the source node in the transistor 121 converges on a threshold voltage of the transistor 121. Here, when the threshold voltage is expressed as Vth for convenience, the gate node g of the transistor 121 converges on a voltage (Vel−Vth) corresponding to a threshold voltage Vth.

At the beginning of the compensation period (D), a current needs to flow from the source node toward the drain node in the transistor 121 that is in the diode coupled state. Thus, the voltage Vini applied to the gate node g during the initialization period (D) before the compensation period (D) is in a relationship of Vini<Vel−Vth.

Further, in the compensation period (D), the gate node g of the transistor 121 is coupled to the data line 14b via the transistor 122, and the drain node of the transistor 121 is coupled to the data line 14b via the transistor 123. Thus, the data line 14b and the other end of the capacitive element 74 also converge on the voltage (Vel−Vth). Therefore, the capacitive element 74 is charged to a voltage |Vel−Vth−Vref|.

On the other hand, in the compensation period (D), the control signals Sel(1) to Sel(q) are sequentially and exclusively at the H level. Although omitted in FIG. 9, in the compensation period (D), the control signals /Sel(1) to /Sel(q) are sequentially and exclusively at the L level in synchronization with the control signals Sel(1) to Sel(q).

In addition, the data signal output circuit 30 outputs the first data signals Vd(1) to Vd(3) of three pixels corresponding to intersections between the scanning lines 12 in the i-th row and the data lines 14b belonging to the j-th group, when the control signal Sel(j) of the control signals Sel(1) to Sel(q) is at the H level, for example. More specifically, in a period in which the control signal Sel(j) is at the H level, the data signal output circuit 30 outputs the first data signal Vd(1) corresponding to the pixel of the column (3j−2) in the i-th row, outputs the first data signal Vd(2) corresponding to the pixel of the column (3j−1) in the i-th row, and outputs a first data signal Vd(3) corresponding to the pixel of the column 3j in the i-th row.

As a specific example, when j is "2," the data signal output circuit 30 outputs the first data signal Vd(1) corresponding to a pixel of a fourth column in the i-th row, outputs the first data signal Vd(2) corresponding to a pixel of a fifth column in the i-th row, and outputs the first data signal Vd(3) corresponding to a pixel of a sixth column in the i-th row in a period in which the control signal Sel(2) is at the H level.

When the control signals Sel(1) to Sel(q) are sequentially and exclusively at the H level, the voltage of the first data signal corresponding to each of the pixels is held in the capacitive element 51 corresponding to each of the columns 1 to 3q.

FIG. 9 shows a state in which the control signal Sel(j) corresponding to the j-th group to which the pixel circuit 110 belongs is at the H level in the compensation period (D), and the voltage Vdata of the first data signal Vd (1) is held in the capacitive element 51.

In the write period (E) in each of the horizontal scanning periods (H), the control signal /Gini is at the H level, the control signal /Gorst is at the H level, the control signal /Drst is at the H level, the control signal Gref is at the L level, and the control signal Gcp is at the H level. Thus, the transistors 68, 67, and 66 remain off, the transmission gate 73 changes to be turned off, and the transmission gate 72 changes to be turned on. In addition, in the write period (E) of the horizontal scanning period (H) in which the i-th row is selected, the scanning signal /Gwr(i) is maintained at the L level, the control signal /Gcmp(i) changes to the H level, and the control signal /Gel(i) is maintained at the H level. Thus, in the pixel circuit 110, the transistor 122 is turned on, and the transistors 123 and 124 are turned off.

Figure 10:
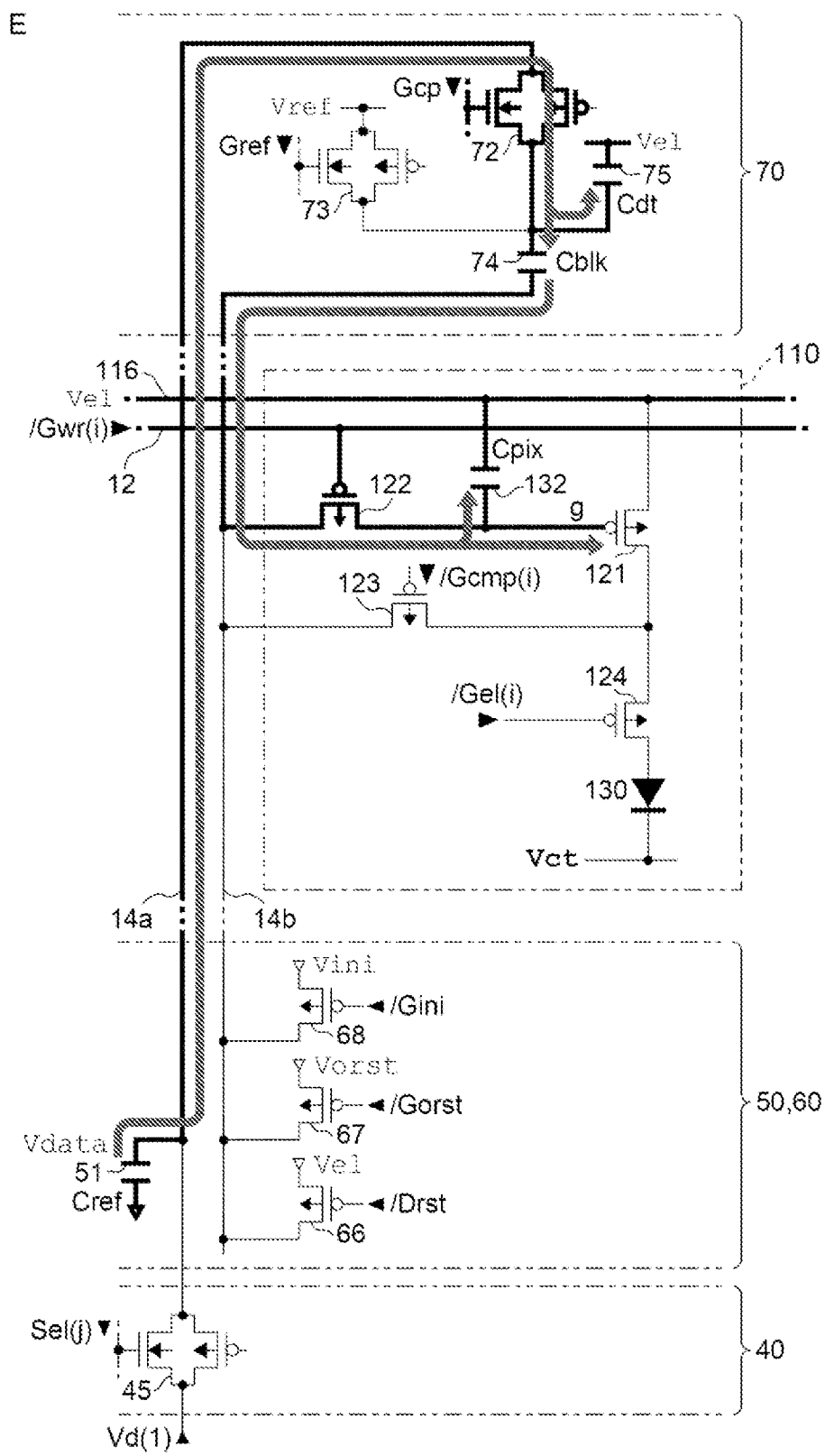
FIG. 10 is a diagram for explaining the operation of the display device.

Thus, in the write period (E) of the horizontal scanning period (H) in which the i-th row is selected, as shown in FIG. 10, one end of the capacitive element 74 is changed according to the voltage held in the capacitive element 51 from the voltage Vref by the transmission gate 73 being turned off and the transmission gate 72 being turned on. The voltage change is propagated to the gate node g via the capacitive element 74, the data line 14b and the transistor 122 in order. A voltage of the gate node g after the voltage change is held in the capacitive element 132.

As shown in FIG. 10, a capacitance of the capacitive element 51 is represented as Cref, a capacitance of the capacitive element 74 is represented as Cblk, a capacitance of the capacitive element 75 is represented as Cdt, and a capacitance of the capacitive element 132 is represented as Cpix. Further, in the compensation period (D), the voltage of the first data signal Vd(1) held in the capacitive element 51 is represented as Vdata.

The voltage change ΔV of the gate node g from the compensation period (D) to the write period (E) is expressed by the following Equation (1).

[Equation 1]

$$\Delta V = \frac{\frac{Cblk(Cdt+Cpix)}{Cblk+Cdt+Cpix} \times Vref | Cref \times Vdata}{\frac{Cblk(Cdt+Cpix)}{Cblk|Cdt|Cpix} \times (Vdata-Vref)} - Vref \quad (1)$$

$$= \frac{Cref}{\frac{Cblk(Cdt+Cpix)}{Cblk+Cdt+Cpix}} \times (Vdata - Vref)$$

$$= Ka \times (Vdata - Vref)$$

That is, as shown in Equation (1), the gate node g changes to a value obtained by multiplying the voltage change (Vdata-Vref) at one end of the capacitive element 74 by a coefficient Ka. The coefficient Ka is a coefficient less than "1" and is determined by the capacitances Cref, Cblk, Cdt, and Cpix. In other words, the capacitances Cref, Cblk, Cdt, and Cpix are designed to be appropriate values so that the coefficient Ka is less than "1". When the coefficient Ka is less than "1", a voltage amplitude from the lowest value to the highest value of the voltage Vdata of the first data signal is compressed in accordance with the coefficient Ka and is propagated to the gate node g.

When the pixel circuit 110 is miniaturized, the current flowing in the OLED 130 may vary greatly with respect to a negligible change in the voltage Vgs between the gate node and source node of the transistor 121.

Even in this case, in the exemplary embodiment, since the voltage amplitude of the voltage Vdata of the first data signal is compressed in accordance with the coefficient Ka and is propagated to the gate node g, the current flowing in the OLED 130 can be controlled with high accuracy.

Figure 11:
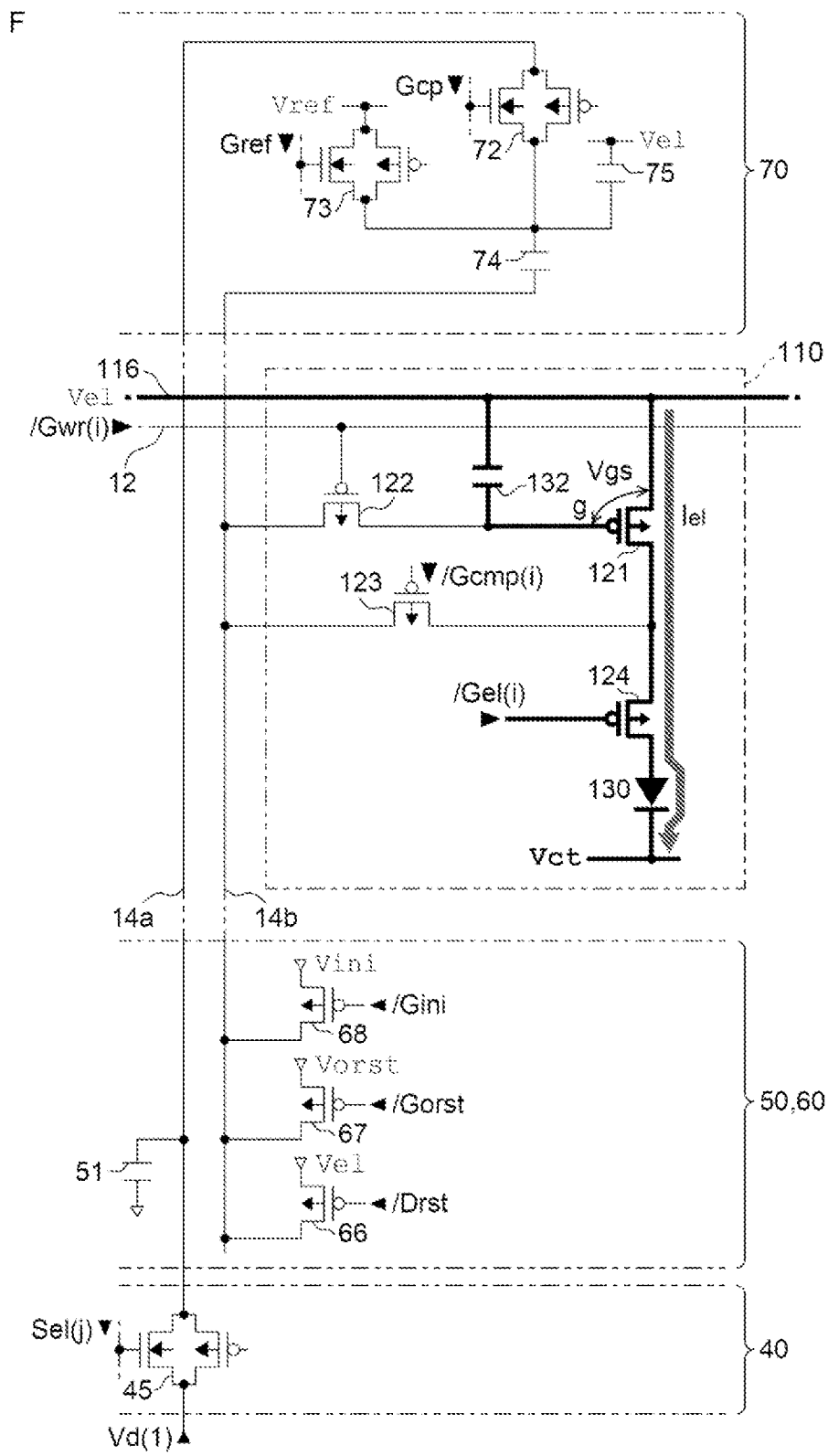
FIG. 11 is a diagram for explaining the operation of the display device.

After the completion of the write period (E), the light emission period (F) is reached. That is, when the light emission period (F) is reached after the selection of the scanning line 12 in the i-th row is completed, the control signal /Gel(i) is at the M level. Thus, as shown in FIG. 11, the transistor 121 causes a current Iel limited by resistance between the source and drain of the transistor 124 and corresponding to the voltage Vgs to flow to the OLED 130. Thus, the OLED 130 emits light at a luminance corresponding to the current Iel.

In FIGS. 6 to 11, regions in which the capacitive element group 50 and the initialization circuit 60 are provided are not particularly distinguished.

In the exemplary embodiment, the amplitude of the voltage Vdata of the first data signal output from the data signal output circuit 30 is compressed by passing through the capacitive element 74 and is then supplied as the second data signal to the gate node g of the pixel circuit 110.

On the other hand, in the exemplary embodiment, the threshold voltage Vth of the transistor 121 is compensated for in the compensation period (D).

Therefore, next, the usefulness of the compensation period (D) will be described. In the description of the usefulness, in order to avoid complicating the Equation, it is assumed that a compression ratio of the voltage Vdata of the first data signal is "1", that is, the voltage Vdata of the first data signal is supplied to the data line 14b as it is in the write period (E) after the compensation period (D). In addition, it is assumed that the L level is applied to the gate node of the transistor 124 instead of the M level in the light emission period (F), and the transistor 124 is turned on, and the resistance between the source node and the drain node is ideally zero.

First, the current Iel flowing in the OLED 130 in the light emission period (F) can be expressed as in the following Equation (2).

[Equation 2]

$$Iel = k_1(Vgs - Vth)^2 \quad (2)$$

The coefficient k1 in Equation (2) is represented by the following Equation (3).

[Equation 3]

$$k_1 = (W/2L) \cdot \mu Cox \quad (3)$$

In Equation (3), W is a channel width of the transistor 121, L is a channel length of the transistor 121, μ is mobility of the carrier, and Cox is a capacitance per unit area of a (gate) oxide film in the transistor 121.

In a configuration in which the voltage Vdata of the first data signal is not compressed and the threshold voltage of the transistor 121 is not compensated for, when the voltage Vdata of the first data signal is directly applied to the gate node g of the transistor 121, the voltage Vgs between the gate node and source node of the transistor 121 can be expressed as the following Equation (4).

[Equation 4]

$$Vgs = |Vel - Vdata| \quad (4)$$

At this time, the current Iel flowing in the OLED 130 can be expressed by the following Equation (5).

[Equation 5]

$$Iel = k_1(Vgs - Vth)^2 \quad (5)$$
$$= k_1(Vel - Vdata - Vth)^2$$

As represented in Equation (5), the current Iel is affected by the threshold voltage Vth. Here, in a relationship of a semiconductor process, a variation in the threshold voltage Vth of the transistor 121 is in a range of several mV to several tens of mV. When the threshold voltage Vth of the transistor 121 varies within the range of several mV to several tens of mV, the current Iel may have a difference of up to 40% between the adjacent pixel circuits 110.

Current-luminance characteristics at the OLED 130 are generally linear. Thus, in a configuration that the threshold voltage Vth is not compensated for, even when the first data signal of the same voltage Vdata is supplied to the two pixel circuits 110 in order to cause the two OLEDs 130 to emit light at the same luminance, the current flowing in the OLED 130 is actually different. Thus, in the configuration that the threshold voltage Vth is not compensated for, the display quality is greatly impaired due to a variation in the luminance.

In the compensation period (D), when the gate node g of the transistor 121 converges on the voltage (Vel−Vth) and then changed to the voltage Vdata, the voltage Vgs between the gate node and source node of the transistor 121 can be expressed as the following Equation (6).

[Equation 6]

$$Vgs = Vth - k_2(Vdata - Vref) \quad (6)$$

A coefficient k2 in Equation (6) is a coefficient determined by the capacitances Cblk and Cpix in a configuration in which the voltage Vdata of the first data signal is not compressed (a configuration in which the capacitive element 74 is not provided).

When the voltage Vgs is represented as in Equation (6), the current Iel flowing in the OLED 130 can be expressed by the following Equation (7).

[Equation 7]

$$Iel = k_1\{Vth - k_2(Vdata - Vref) - Vth\}^2 \quad (7)$$
$$= k_1 k_2 (Vref - Vdata)^2$$

In Equation (7), the term of the threshold voltage Vth is removed, and the current Iel is determined by the voltage Vdata of the first data signal. Thus, a decrease in the display quality caused by the threshold voltage Vth of the transistor 121 can be curbed.

In the exemplary embodiment, actually as shown in Equation (1), the voltage amplitude from the lowest value to the highest value of the voltage Vdata of the first data signal is compressed in accordance with the coefficient Ka and propagated to the gate node g.

In addition, in the exemplary embodiment, the M level is supplied to the gate node of the transistor 124 in the light emission period (F), and the current Iel is limited, but the decrease in the display quality caused by the threshold voltage Vth is still curbed.

Next, in the exemplary embodiment, the usefulness of applying the M level to the gate node of the transistor 124 in the light emission period (F) will be described.

The reason for applying the M level to the gate node of the transistor 124 is because a constant current property due to the transistor 121 is maintained regardless of a change over time in current voltage characteristics at the OLED 130 by operating the transistor 124 in a saturation region.

Specifically, when the current Iel flows, the OLED 130 emits light at a luminance corresponding to the current Iel. In the pixel circuit 110 of the exemplary embodiment, the constant current property of the current Iel flowing from the power supply line 116 to the OLED 130 is ensured by the voltage of the gate node g in the transistor 121 being held by the capacitive element 132.

However, in the OLED 130, element characteristics change due to the passage of a light emission time, and the potential of the anode (the pixel electrode 213) required to cause a constant current to flow gradually increases. When the potential of the anode in the OLED 130 increases, an equilibrium point of the potential in the path from the power supply line 116 to the common electrode 218 changes, and the potential of the source node of the transistor 124, that is, the drain node of the transistor 121 increases. When the potential of the drain node of the transistor 121 increases, the voltage between the source node and drain node in the transistor 121 also varies, and the current flowing to the drain node of the transistor 121 also varies, and thus, the constant current property of the OLED 130 is impaired.

Therefore, in the exemplary embodiment, as a countermeasure to the impairment of the constant current property due to the change over time in the element characteristics of the OLED 130, the transistor 124 is operated in the saturation region.

When the transistor 124 is operated in the saturation region, the transistor 124 is directly affected even when the potential of the anode at the OLED 130 changes. The transistor 121 is affected by the potential variation in the drain node of the transistor 124, but the variation in the drain current in the saturation region is small. Accordingly, the influence of the variation in the drain potential in the transistor 121 coupled to the transistor 124 and, as a result, the variation in the gate potential due to a current leakage is mitigated.

MODIFIED EXAMPLES, APPLICATION EXAMPLES, AND THE LIKE

In the above-described embodiments, the following application examples and modified examples are possible.

Figure 12:
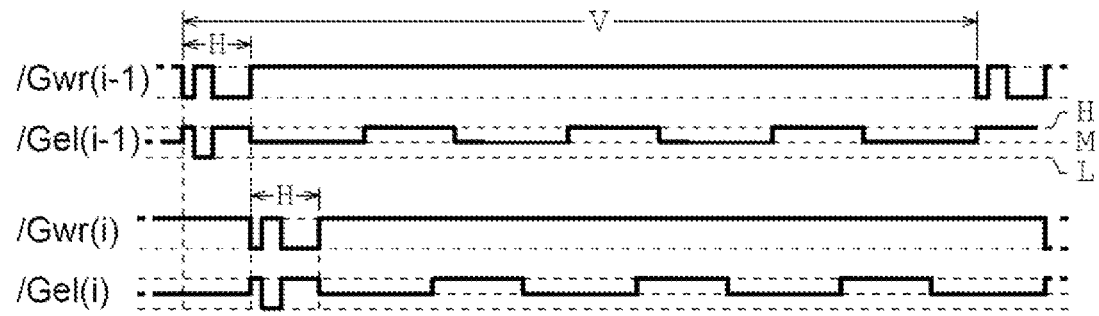
FIG. 12 is a timing chart showing an operation of a display device according to an application example.

In the exemplary embodiment, for the sake of explanation, for example, the light emission period (F) in the i-th row is configured to be continuous in a period other than the horizontal scanning period in which the scanning line 12 in the i-th row is selected. The present disclosure is not limited to this configuration, and, for example, as shown in FIG. 12, a non-light emission period in which the control signal /Gel (i) is at the H level may be appropriately inserted, and the non-light emission period and the light emission period (F) may be alternately repeated.

In the embodiment, an example in which the phase is converted to three phases by the serial-parallel conversion has been described, but the number of phases may be two or more. Also, rather than the serial-parallel conversion, a configuration in which the first data signal is supplied in a dot-sequential manner and sampled to the capacitive element 51 by the transmission gate 45 being turned on may be adopted.

The channels of the transistors 66 to 68, and 121 to 124 are not limited to the exemplary embodiment. Furthermore, the transistors 66 to 68, and 121 to 125 may be replaced with transmission gates as appropriate. Conversely, the transmission gate 45, 72, and 73 may be replaced with a transistor of one-side channel.

In addition, in the exemplary embodiment, the OLED 130 has been described as an example of the display element, but other display elements that require the constant current property may be used.

Electronic Apparatus

Next, an electronic apparatus to which the display device 10 according to the exemplary embodiment and the like is applied will be described. The display device 10 is suitable for application with a small pixel and high definition display. Therefore, a head-mounted display will be described as an example of the electronic apparatus.

Figure 13:
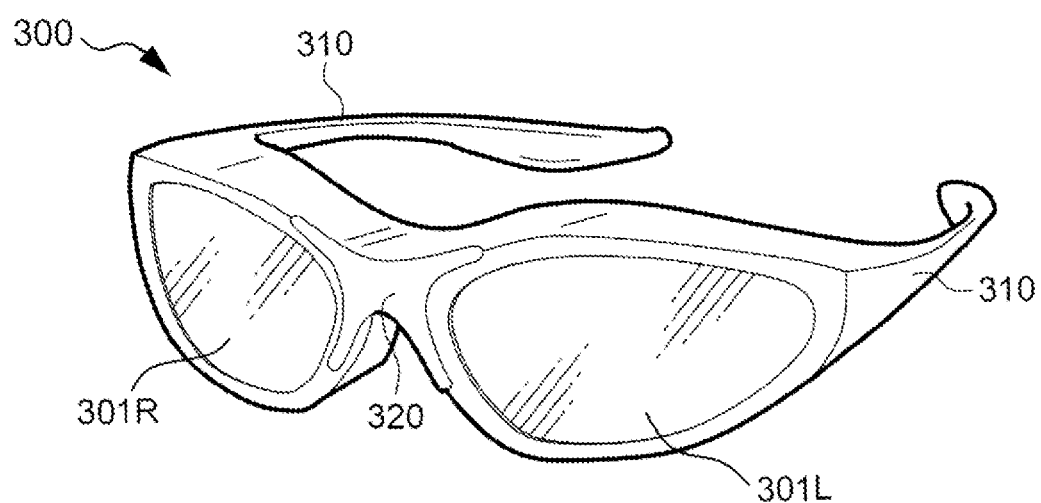
FIG. 13 is a perspective view of a head-mounted display using the display device.
Figure 14:
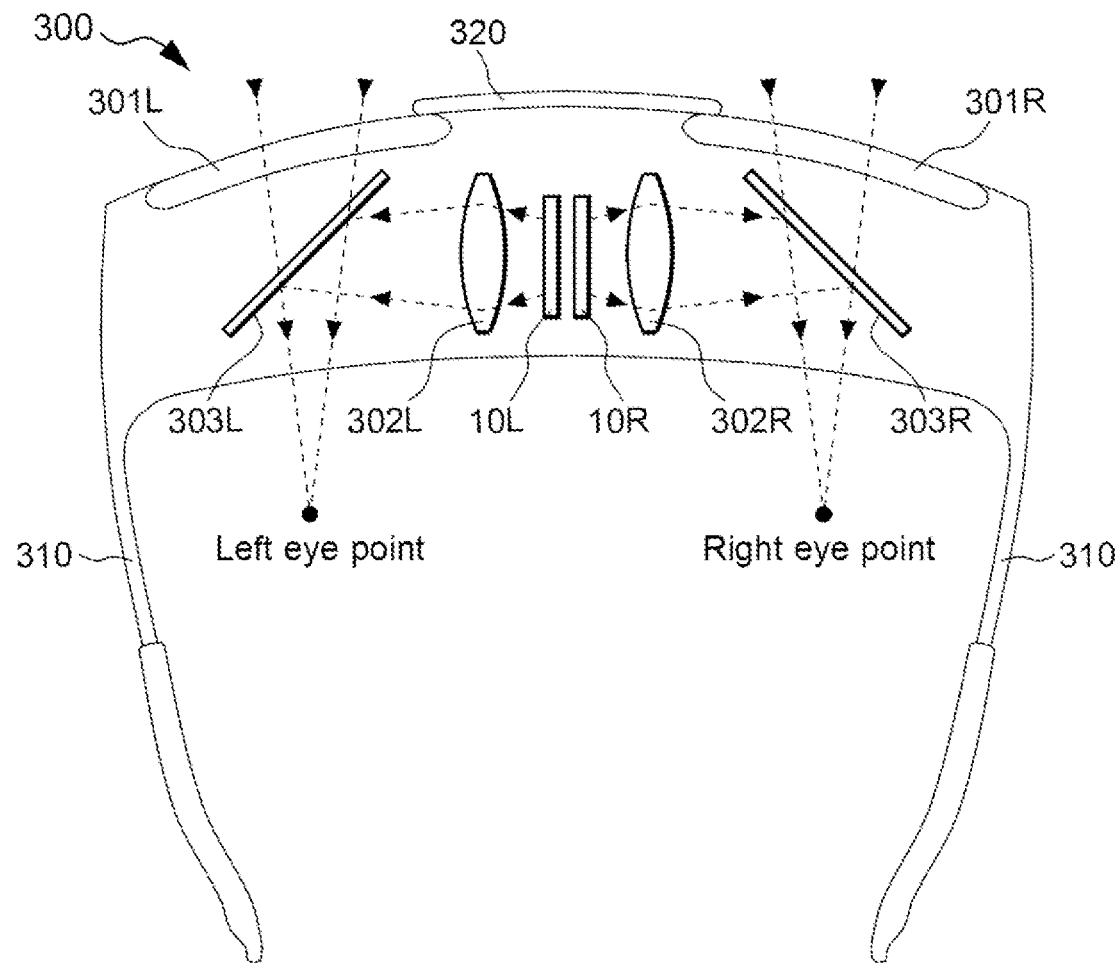
FIG. 14 is a diagram showing an optical configuration of the head-mounted display.

FIG. 13 is a view showing an exterior of a head-mounted display, and FIG. 14 is a view showing an optical configuration of the head-mounted display.

First, as shown in FIG. 13, a head-mounted display 300 includes temples 310, a bridge 320, lenses 301L and 301R, similar to general eyeglasses, in appearance. Further, as shown in FIG. 14, in the head-mounted display 300, a display device 10L for a left eye and a display device 10R for a right eye are provided in the vicinity of the bridge 320 and on the back side of the lenses 301L and 301R (the lower side in the drawing).

An image display surface of the display device 10L is disposed to be on the left side in FIG. 14. Accordingly, a display image by the display device 10L is output via an optical lens 302L in a 9-o'clock direction in the drawing. A half mirror 303L reflects the display image by the display device 10L in a 6-o'clock direction, while the half mirror 303L transmits light that is incident in a 12-o'clock direction. An image display surface of the display device 10R is disposed on the right side opposite to the display device 10L. Accordingly, an display image by the display device 10R is output via an optical lens 302R in a 3-o'clock direction in the drawing. A half mirror 303R reflects the display image by the display device 10R in the 6-o'clock direction, while the half the mirror 303R transmits light that is incident in the 12-o'clock direction.

In such a configuration, a wearer of the head-mounted display 300 can observe the display images by the display devices 10L and 10R in a see-through state in which the display images by the display devices 10L and 10R overlap external views.

In addition, in the head-mounted display 300, when the image for a left eye among the images for both eyes with parallax is displayed on the display device 10L, and the image for a right eye is displayed on the display device 10R, it is possible to make the wearer perceive the display images as if the displayed images have a depth and a three dimensional effect.

The electronic apparatus including the display device 10 can be applied to an electronic viewfinder in a video camera, a lens-exchangeable digital camera, or the like, in addition to the head-mounted display 300.

Supplementary Note

A display device according to one aspect (a first aspect) includes a pixel circuit provided corresponding to a data line and a scanning line, and the pixel circuit includes a first transistor, a second transistor, a third transistor, a fourth transistor, and a display element, wherein the first transistor includes a gate node, a source node, and a drain node, and the first transistor causes a current in accordance with a voltage between the gate node and the source node to flow to the display element via the fourth transistor, the second transistor is disposed between the data line and the gate node of the first transistor to be turned on or off in accordance with a potential of the scanning line, the third transistor is disposed between the data line and the drain node of the first transistor, and the fourth transistor is disposed between the drain node of the first transistor and the display element.

According to such an aspect, since the number of transistors in the pixel circuit is reduced compared with the configuration in the related art, for example, the configuration disclosed in JP-A-2016-212444, it is easy to achieve miniaturization and high definition. Also, since the number of transistors in the pixel circuit is reduced, a yield can be improved.

The transistor 121 is an example of the first transistor, the transistor 122 is an example of the second transistor, the transistor 123 is one example of the third transistor, and the transistor 124 is one example of the fourth transistor. Additionally, the OLED 130 is an example of a display element.

In a display device according to a specific aspect (a second aspect) of the first aspect, in a first period, the second transistor is turned on, the third transistor and the fourth transistor are turned off, and a voltage that turns on the first transistor is applied to the gate node of the first transistor via the data line, and in a second period after the first period, the second transistor and the third transistor are turned on, and the fourth transistor is turned off, and in a third period after the second period, the second transistor is turned on, the third transistor and the fourth transistor are turned off, and a data signal having a voltage in accordance with a current flowing in the display element is supplied to the data line.

According to such an aspect, since the gate node and the drain node of the first transistor are coupled by the second transistor and the third transistor being turned on in the second period, the gate node of the first transistor and the data line converge on a voltage in accordance with a threshold voltage. In the third period after the second period, the data line changes to the voltage of the data signal, and the change is propagated to the gate node of the first transistor via the first transistor being turned on. Thus, the first transistor is in a state in which a threshold of the first transistor is compensated for.

The initialization period (C) is one example of the first period, the compensation period (D) is one example of the second period, and the write period (E) is one example of the third period.

In a display device according to a specific aspect (a third aspect) of the second aspect, a current flows through the display element via the first transistor and the fourth transistor in a fourth period after the third period.

According to such an aspect, in a state in which the threshold of the first transistor is compensated for, since the first transistor causes a current in accordance with the voltage of the gate node to flow to the display element in the third period, the display quality can be improved.

The light emission period (F) is an example of the fourth period.

In a display device according to a specific aspect (a fourth aspect) of the third aspect, the fourth transistor includes a gate node, a first voltage is applied to the gate node of the fourth transistor in the fourth period, and the first voltage is a voltage between a second voltage that turns on the fourth transistor and a third voltage that turns off the fourth transistor.

According to such an aspect, since the fourth transistor is operated in the saturation region in the fourth period, a constant current property due to the first transistor can be ensured even when characteristics of the display element change.

The M level is one example of the first voltage, the L level is one example of the second voltage, and the H level is one example of the third voltage.

In a display device according to a specific aspect (a fifth aspect) of anyone of the first to fourth aspects, the display element is an OLED having one end and the other end, the one end is coupled to the fourth transistor, the first period includes a first initialization period, a second initialization period, and a third initialization period, and in the first initialization period, the second transistor is turned on, the third transistor and the fourth transistor are turned off, and a voltage that turns off the first transistor is applied to the gate node of the first transistor via the data line and the second transistor, and in the second initialization period, the second transistor is turned off, the third transistor and the fourth transistor are turned on, and a voltage that causes the OLED not to emit light is applied to one end of the display element via the data line, the third transistor, and the fourth transistor, and in the third initialization period, the second transistor is turned on, the third transistor and the fourth transistor are turned off, and a voltage that turns on the first transistor is applied to the gate node of the first transistor via the data line.

According to such an aspect, a voltage that turns off the first transistor is applied to the gate node of the first transistor in the first initialization period. Thus, the current flowing in the OLED is shut off. In the second initialization period, the one end of the OLED is reset to the voltage that causes the OLED not to emit light. Thus, a phenomenon in which light is slightly emitted by a capacitive component that is parasitic to the OLED is curbed. In the third initialization period, a voltage that turns on the first transistor is applied to the gate node of the first transistor. Therefore, a current can reliably flow between the source node and the drain node of the first transistor at the beginning of the next compensation period.

The initialization period (A) is one example of the first initialization period, the initialization period (B) is one example of the second initialization period, and the initialization period (C) is one example of the third initialization period. In addition, the pixel electrode 213 is an example of the one end of the OLED, and the common electrode 218 is an example of the other end of the OLED.

An electronic apparatus according to a specific aspect (a sixth aspect) of the first to fifth aspects includes the display device according to any one of the above-described aspects. According to such an aspect, the miniaturization and the high definition of the display device can be achieved.

What is claimed is:
1. A display device comprising:
a pixel circuit provided corresponding to a data line and a scanning line, wherein
the pixel circuit includes a first transistor, a second transistor, a third transistor, a fourth transistor, and a display element,
the first transistor supplies a current in accordance with a voltage between a gate node of the first transistor and a source node of the first transistor to the display element via the fourth transistor,
the second transistor is disposed between the data line and the gate node of the first transistor and is turned on or off in accordance with a potential of the scanning line,
the third transistor is disposed between the data line and a drain node of the first transistor,
the fourth transistor is disposed between the drain node of the first transistor and the display element, wherein
in a first period, the second transistor is on state, the third transistor and the fourth transistor are off state, and a voltage that turns on the first transistor is applied to the gate node of the first transistor via the data line,
in a second period after the first period, the second transistor and the third transistor are on state, and the fourth transistor is off state, and
in a third period after the second period, the second transistor is on state, the third transistor and the fourth transistor are off state, and a data signal having a voltage in accordance with a current flowing to the display element is supplied to the data line.

2. The display device according to claim 1, wherein
in a fourth period after the third period, the fourth transistor is on state, and a current flows to the display element via the first transistor and the fourth transistor.

3. The display device according to claim 2, wherein
the fourth transistor includes a gate node,
in the fourth period, a first voltage is applied to the gate node of the fourth transistor, and
the first voltage is a voltage between a second voltage that turns on the fourth transistor and a third voltage that turns off the fourth transistor.

4. The display device according to claim 1, wherein
the display element is an OLED having one end and another end, and the one end is coupled to the fourth transistor,
the first period includes a first initialization period, a second initialization period, and a third initialization period,
in the first initialization period, the second transistor is on state, the third transistor and the fourth transistor are off state, and a voltage that turns off the first transistor is applied to the gate node of the first transistor via the data line and the second transistor,
in the second initialization period, the second transistor is off state, the third transistor and the fourth transistor are on state, and a voltage that causes the OLED not to emit light is applied to one end of the display element via the data line, the third transistor, and the fourth transistor, and
in the third initialization period, the second transistor is on state, the third transistor and the fourth transistor are off state, and a voltage that turns on the first transistor is applied to the gate node of the first transistor via the data line.

5. An electronic apparatus comprising the display device according to claim 1.

6. A display device comprising:
a data line;
a scanning line;
a display element provided corresponding to an intersection of the data line and the scanning line;
a first transistor configured to supply a current in accordance with a voltage between a gate and a source thereof to the display element;
a second transistor electrically coupled between the data line and the gate of the first transistor, the second transistor having a gate electrically coupled to the scanning line;
a third transistor electrically coupled between a drain of the first transistor and the data line; and
a fourth transistor electrically coupled between the first transistor and the display element, wherein
in a first period, the first transistor and the second transistor are off state, the third transistor and the fourth transistor are on state, and the data line and the display element are electrically coupled, and
in a second period, the first transistor, the second transistor and the third transistor are on state, the fourth transistor is off state, and the drain of the first transistor and the gate of the first transistor are electrically coupled.

7. The display device according to claim 6, wherein
in the first period, a first potential that causes the display element to be in a non-light-emission state is supplied to the display element via the data line, and
in the second period, the same potential as that of a power supply line electrically coupled to the source of the first transistor is supplied to the data line.

8. The display device according to claim 7, wherein
in a third period between the first period and the second period,
a second potential that is lower than potential of the power supply line is supplied to the data line, and
the first transistor, the third transistor and the fourth transistor are off state, the second transistor is on state, and the initial potential is supplied to the gate of the first transistor.

9. The display device according to claim 6, wherein
in a third period between the first period and the second period,
a second potential that is lower than potential of a power supply line is supplied to the data line, and
the first transistor, the third transistor and the fourth transistor are off state, the second transistor is on state, and the initial potential is supplied to the gate of the first transistor.

* * * * *